(12) United States Patent
Narathong et al.

(10) Patent No.: US 7,924,069 B2
(45) Date of Patent: Apr. 12, 2011

(54) MULTI-MODULUS DIVIDER RETIMING CIRCUIT

(75) Inventors: Chiewcharn Narathong, Laguna Niguel, CA (US); Wenjun Su, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1088 days.

(21) Appl. No.: 11/560,678

(22) Filed: Nov. 16, 2006

(65) Prior Publication Data

US 2008/0042697 A1 Feb. 21, 2008

Related U.S. Application Data

(60) Provisional application No. 60/817,573, filed on Jun. 28, 2006, provisional application No. 60/833,156, filed on Jul. 24, 2006.

(51) Int. Cl.
*H03B 19/00* (2006.01)

(52) U.S. Cl. .......................................... 327/117; 377/47

(58) Field of Classification Search .................. 327/115, 327/117; 377/47
See application file for complete search history.

(56) References Cited

U.S. PATENT DOCUMENTS

| | | | | |
|---|---|---|---|---|
| 5,065,415 A * | 11/1991 | Yamashita | ....................... | 377/52 |
| 5,195,111 A * | 3/1993 | Adachi et al. | ................... | 377/52 |
| 6,108,393 A * | 8/2000 | Opsahl | ............................ | 377/47 |
| 6,750,686 B2 * | 6/2004 | Wang | ............................. | 327/115 |
| 6,842,054 B2 * | 1/2005 | Wang | ............................. | 327/115 |
| 7,042,257 B2 * | 5/2006 | Wang | ............................. | 327/115 |
| 7,109,762 B2 * | 9/2006 | Neurauter et al. | ............ | 327/115 |
| 7,170,965 B2 * | 1/2007 | Chien | ........................... | 375/376 |
| 7,379,522 B2 * | 5/2008 | Narathong et al. | ............. | 377/47 |
| 7,551,707 B2 * | 6/2009 | Chiu et al. | ...................... | 377/47 |
| 7,564,276 B2 * | 7/2009 | Narathong et al. | ........... | 327/117 |
| 2004/0140831 A1 * | 7/2004 | Wang | ............................ | 327/115 |

FOREIGN PATENT DOCUMENTS

WO 02093747 11/2002

OTHER PUBLICATIONS

International Search Report, PCT/US07/074257, International Search Authority, European Patent Office, Apr. 4, 2008.
Written Opinion, PCT/US07/074257, International Search Authority, European Patent Office, Apr. 4, 2008.

* cited by examiner

*Primary Examiner* — Lincoln Donovan
*Assistant Examiner* — William Hernandez
(74) *Attorney, Agent, or Firm* — Jiayu Xu

(57) ABSTRACT

A multi-modulus divider (MMD) receives an MMD input signal and outputs an MMD output signal SOUT. The MMD includes a chain of modulus divider stages (MDSs). Each MDS receives an input signal, divides it by either two or three, and outputs the result as an output signal. Each MDS responds to its own modulus control signal that controls whether it divides by two or three. In one example, a sequential logic element outputs SOUT. The low jitter modulus control signal of one of the first MDS stages of the chain is used to place a sequential logic element into a first state. The output signal of one of the MDS stages in the middle of the chain is used to place the sequential logic element into a second state. Power consumption is low because the sequential logic element is not clocked at the high frequency of the MMD input signal.

20 Claims, 9 Drawing Sheets

MULTI-MODULUS DIVIDER

EQUATION FOR SEVEN-STAGE MODULUS DIVIDER

DIVIDE-BY-2/3 CELL
CONCEPTUAL DIAGRAM USING LOGIC GATE SYMBOLS

RETIMING CIRCUIT

OPERATION OF RETIMING CIRCUIT

RETIMING CIRCUIT
ALTERNATIVE CIRCUIT

OPERATION OF RETIMING CIRCUIT
ALTERNATIVE CIRCUIT

DIFFERENTIAL LATCH

MULTI-MODULUS DIVIDER RETIMING CIRCUIT

CROSS-REFERENCE TO RELATED APPLICATION

This application claims the benefit under 35 U.S.C. §119 of Provisional Application Ser. No. 60/817,573, filed Jun. 28, 2006, said provisional application is incorporated herein by reference and Provisional Application Ser. No. 60/833,156, filed Jul. 24, 2006, said provisional application is incorporated herein by reference.

BACKGROUND

1. Technical Field

The disclosed embodiments relate to multi-modulus dividers (MMDs).

2. Background Information

The receiver and transmitter circuitry within a cellular telephone typically includes one or more local oscillators. Such a local oscillator may, for example, include a phase-locked loop (PLL) that receives a stable but relatively low frequency signal (for example, 20 MHz) from a crystal oscillator and generates the output signal of the selected relatively high frequency (for example, 900 MHz). The feedback loop of the PLL includes a frequency divider that receives the high frequency signal and divides it down to obtain a low frequency signal that is of the same phase and frequency as the signal from the crystal oscillator.

A type of divider referred to here a "multi-modulus divider" (MMD) is often used to realize the frequency divider. The MMD receives the high frequency input signal SIN and divides it by a divisor value DV to generate the low frequency output signal SOUT. The MMD includes a plurality of modulus divider stages (MDSs) that are chained together to form the MMD. Each MDS (except the last MDS) receives a feedback modulus control signal from the next MDS in the chain. Each MDS also receives a modulus divisor control signal S. If the modulus divisor control signal S for a particular MDS has a first digital logic value then the MDS operates in a divide-by-two mode, otherwise the MDS operates in a divide-by-three mode. The modulus divisor control signal values S of the various MDS stages of the MMD together determine the divisor value DV by which the MMD divides.

In many MMD applications, the MMD output signal is to have a duty cycle of approximately fifty percent. The output signal is also to have low jitter with respect to the high frequency MMD input signal. Each MDS stage introduces an amount of jitter. Due to the cascading of the MDS stages, the jitter of the various MDS stages of the MMD accumulates. In one cellular telephone application involving a cellular telephone standard, using the output of the last MDS as the MMD output results in so much accumulated jitter that the noise requirement imposed on the MMD by the cellular telephone standard cannot be satisfied.

One conventional way to solve this problem is to use the jitter-free high frequency MMD input signal to synchronize (to "reclock") the jittery low frequency MMD output signal with a high speed flip-flop. This makes the output of the flip-flop almost jitter free. This solution, however, generally requires a well-defined phase relationship between the high frequency MMD input signal and the low frequency MMD output signal. Due to the MMD architecture, it may be difficult to maintain an adequately constant phase relationship between the two signals when the divisor value DV is large.

A second conventional way to solve the jitter problem involves three flip-flops. The first flip-flop synchronizes the modulus control signal that controls the first MDS stage with the high frequency MMD input signal. The modulus control signal is the signal that determines whether the first MDS stage divides by two or divides by three. The synchronized output of the first flip-flop is supplied to the clock input of the second flip-flop. The D-input of the second flip-flop is coupled to receive a fixed digital logic high value so that an edge of the synchronized output of the first flip-flop clocks the digital logic high value into the second flip-flop. The reset input of the second flip-flop is coupled to receive a reset signal that is a logical combination of several signals output from several of the MDSs in the middle of the MMD. The reset signal therefore resets the second flip-flop to a digital logic low. The output of the second flip-flop is supplied to the D-input of the third flip-flop and the third flip-flop is clocked using the high frequency MMD input signal so as to synchronize the output of the second flip-flop with the high frequency MMD input signal. The reset input of the third flip-flop is coupled to receive the reset signal. The Q output of the third flip-flop outputs the desired low-jitter low frequency signal that has a duty cycle of approximately fifty percent. Unfortunately, this second conventional solution consumes a large amount of power because two of the three flip-flops are being clocked by the high frequency MMD input signal. Power consumption is therefore undesirably high.

SUMMARY

A multi-modulus divider (MMD) receives an MMD input signal, divides it by a divisor value, and outputs an MMD output signal SOUT. The MMD includes a novel retiming circuit (for example, a sequential logic element) and a chain of modulus divider stages (MDSs). Each MDS receives an input signal, frequency divides it by two or by three, and outputs the result as an output signal. Each MDS responds to its own modulus control signal that controls whether the MDS divides by two or divides by three. The sequential logic element outputs the MMD output signal SOUT. The modulus control signal of one of the first MDS stages of the chain is used to place the sequential logic element into a first state. The output signal of one of the MDS stages in the middle of the chain is used to place the sequential logic element into a second state. In one example, the sequential logic element is a flip-flop. The modulus control signal sets the flip-flop so that the flip-flop is in the "set" state and asserts the output signal SOUT to a digital logic high value. The output signal of the MDS in the middle of the chain resets the flip-flop so that the flip-flop is in the "reset" state and deasserts the output signal SOUT to a digital logic low value.

It is recognized that the modulus control signal that is used to place the sequential logic element into the first state has a small amount of accumulated jitter with respect to the MMD input signal. The modulus control signal is gated by the low jitter output signal of a MDS early in the chain. Because edges of pulses of this modulus control signal have low jitter, the corresponding edges of the output signal SOUT also have low jitter. Moreover, it is also recognized that the output signal of one of the MDS stages transitions approximately halfway between edges of the modulus control signal. This one MDS stage output signal is therefore used to place the sequential logic element back into the second state approximately midway between each pair of adjacent pulses of the modulus control signal so that the output signal SOUT has a duty cycle of approximately 50/50.

In one advantageous aspect, the sequential logic element that generates the output signal SOUT is not clocked at the high frequency of the MMD input signal. The signals that set and reset the sequential logic element have longer minimum pulsewidths than the MMD input signal. Accordingly, the novel retiming circuit consumes significantly less power than does a conventional retiming circuit that uses the higher frequency MMD input signal to retime the MMD output signal.

The foregoing is a summary and thus contains, by necessity, simplifications, generalizations and omissions of detail; consequently, those skilled in the art will appreciate that the summary is illustrative only and does not purport to be limiting. Other aspects, inventive features, and advantages of the devices and/or processes described herein, as defined solely by the claims, will become apparent in the non-limiting detailed description set forth herein.

DETAILED DESCRIPTION

Figure 1:
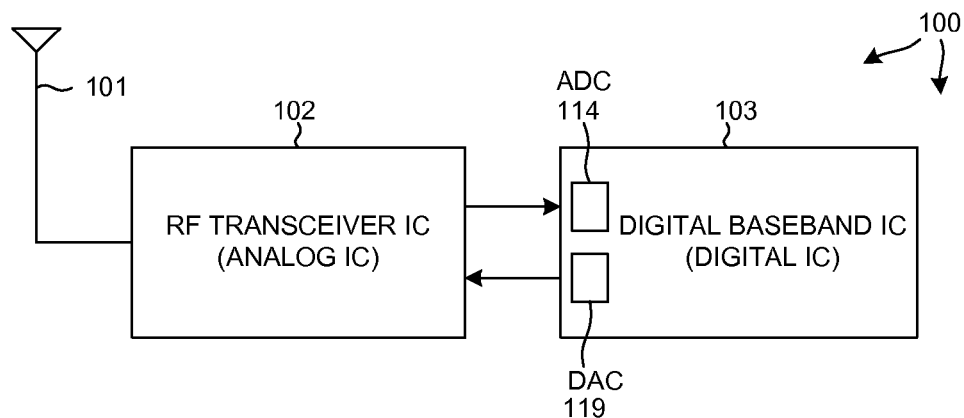
FIG. 1 is a simplified diagram of a mobile communication device (in this example, a cellular telephone) in accordance with one novel aspect.

FIG. 1 is a simplified diagram of a mobile communication device 100 in accordance with one novel aspect. Mobile communication device 100 in this case is a cellular telephone. Cellular telephone 100 includes an antenna 101 and several integrated circuits including a novel radio frequency (RF) transceiver integrated circuit 102 and a digital baseband integrated circuit 103. Digital baseband integrated circuit 103 includes primarily digital circuitry and includes a digital processor. An example of digital baseband integrated circuit 103 is the MSM6280 available from Qualcomm Inc. Novel RF transceiver integrated circuit 102 includes circuits for processing analog signals.

Figure 2:
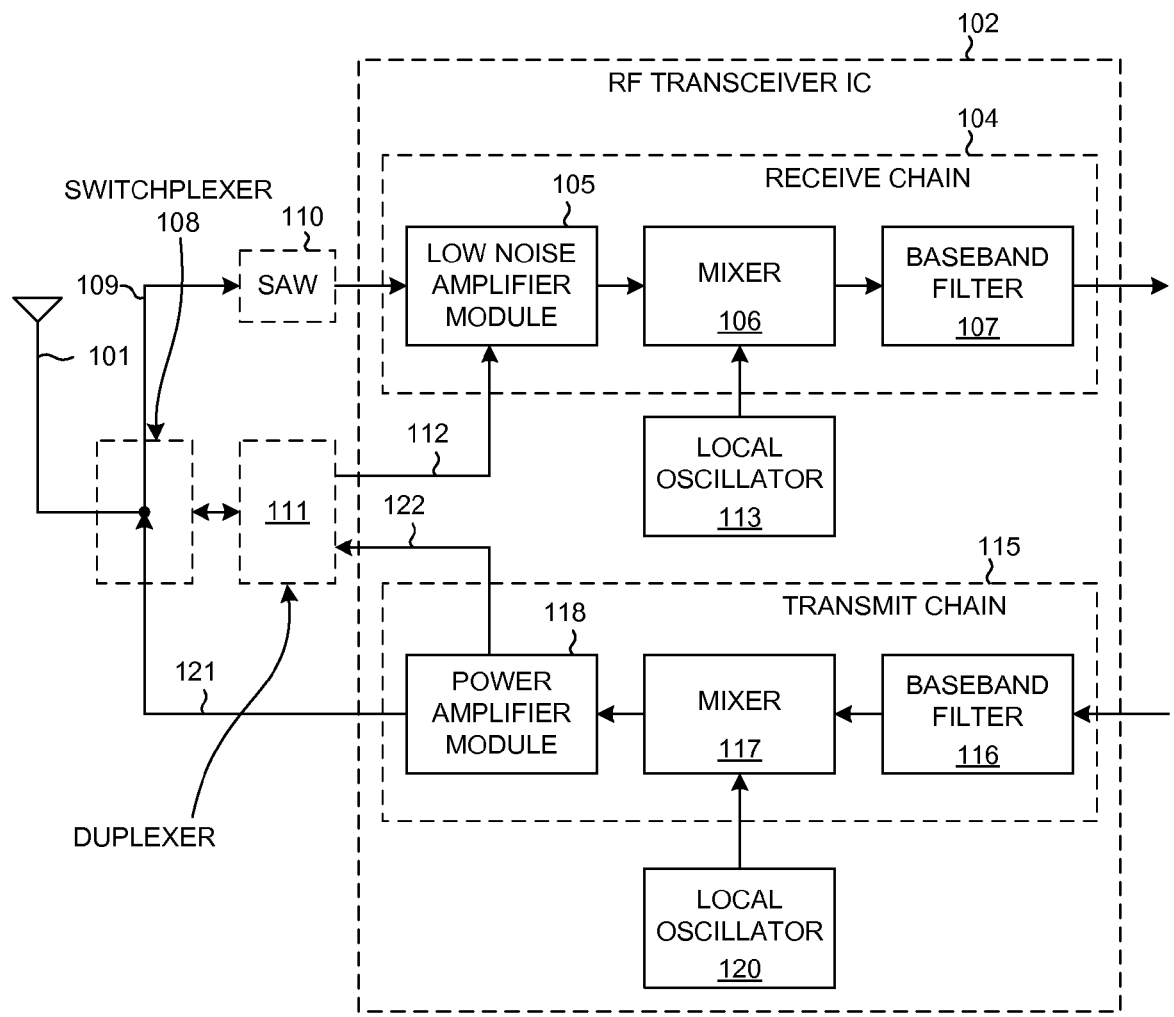
FIG. 2 is a diagram of the RF transceiver integrated circuit within the mobile communication device of FIG. 1.

FIG. 2 is a more detailed diagram of the RF transceiver integrated circuit 102 of FIG. 1. The receiver "signal chain" 104 includes a low noise amplifier (LNA) module 105, a mixer 106, and a baseband filter 107. When receiving in a GSM (Global System for Mobile Communications) mode, a signal on antenna 101 passes through a switchplexer 108 and then through path 109, through a SAW 110 and into LNA 105. When receiving in a CDMA (Code Division Multiple Access) mode, a signal on antenna 101 passes through switchplexer 108, through a duplexer 111, and through path 112 and into LNA 105. In all modes, LNA 105 amplifies the high frequency signal. Local oscillator (LO) 113 supplies a local oscillator signal of an appropriate frequency to mixer 106 so that the receiver is tuned to receive signals of the proper frequency. Mixer 106 demodulates the high frequency signal down to a low frequency signal. Unwanted high frequency noise is filtered out by baseband filter 107. The analog output of baseband filter 107 is supplied to an analog-to-digital converter (ADC) 114 in the digital baseband integrated circuit 103. ADC 114 digitizes the analog signal into digital information that is then processed further by a digital processor in the digital baseband integrated circuit 103.

The transmitter "signal chain" 115 includes a baseband filter 115, a mixer 117 and a power amplifier module 118. Digital information to be transmitted is converted into an analog signal by digital-to-analog converter (DAC) 119 within digital baseband integrated circuit 103. The resulting analog signal is supplied to baseband filter 116 within the RF transceiver integrated circuit 102. Baseband filter 116 filters out unwanted high frequency noise. Mixer 117 modulates the output of baseband filter 116 onto a high frequency carrier. Local oscillator (LO) 120 supplies a local oscillator signal to mixer 117 so that the high frequency carrier has the correct frequency for the channel being used. The high frequency output of mixer 117 is then amplified by power amplifier module 118. When transmitting in the GSM mode, power amplifier module 118 outputs the signal via path 121, through switchplexer 108, and onto antenna 101. When transmitting in a CDMA mode, power amplifier module 118 outputs the signal via path 122 to duplexer 111. The signal passes through duplexer 111, through switchplexer 108, and to antenna 101. The use of duplexer 111 and switchplexer 108 that allow both for non-duplex (for example, GSM) and for duplex (for example, CDMA1X) communication is conventional. The particular implementation of FIG. 2 is just one possible implementation that is presented here for illustrative purposes.

Figure 3:
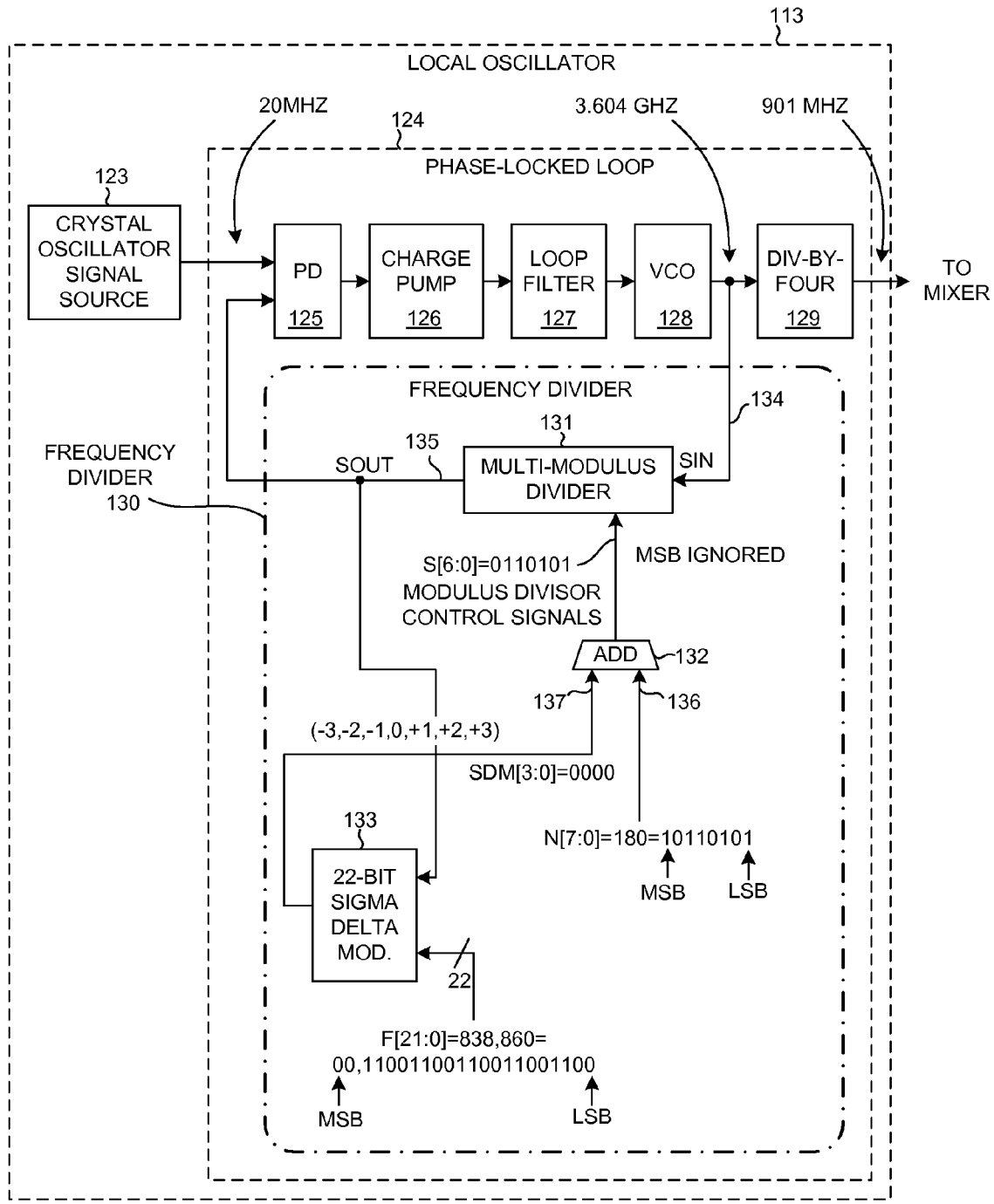
FIG. 3 is a diagram of a local oscillator in the RF transceiver integrated circuit of FIG. 2.

Operation of local oscillators 113 and 120 is explained below in connection with operation of local oscillator (LO) 113 in the receiver. FIG. 3 is a more detailed diagram of local oscillator 113. Local oscillator 113 includes a crystal oscillator signal source 123 and a fractional-N phase-locked loop (PLL) 124. In the present example, the crystal oscillator signal source 123 is a connection to an external crystal oscillator module. Alternatively, the crystal oscillator signal source is an oscillator disposed on RF transceiver integrated circuit 102, where the crystal is external to integrated circuit 102 but is attached to the oscillator via terminals of the integrated circuit 102.

PLL 124 includes a phase-detector (PD) 125, a charge pump 126, a loop filter 127, a voltage controlled oscillator (VCO) 128, a signal conditioning output divider 129, and a novel frequency divider 130 (sometimes called a "loop divider"). Frequency divider 130 receives a frequency divider input signal SIN of a first higher frequency F1, frequency divides the signal by a divisor D, and outputs a frequency divider output signal SOUT of a second lower frequency F2. Over a plurality of count cycles of frequency divider 130, F2=F1/D when the PLL is locked. When locked, the frequency F2 and phase of the SOUT signal matches the frequency and phase of the reference clock signal supplied from crystal oscillator signal source 123.

Frequency divider 130 includes a novel multi-modulus divider (MMD) 131, an adder 132, and a sigma-delta modulator 133. Multi-modulus divider 131 divides the frequency divider input signal SIN on input node(s) 134 by a divisor value DV in a count cycle and generates the frequency divider output signal SOUT on output node(s) 135. The divisor value DV is the sum of a first digital value on first digital input port 136 of adder 132 and a second digital value on second digital input port 137 of adder 132. Sigma delta modulator 133 varies the value on the second digital input port 137 over time such that over multiple count cycles of the MMD, F2=F1/D.

Figure 4:
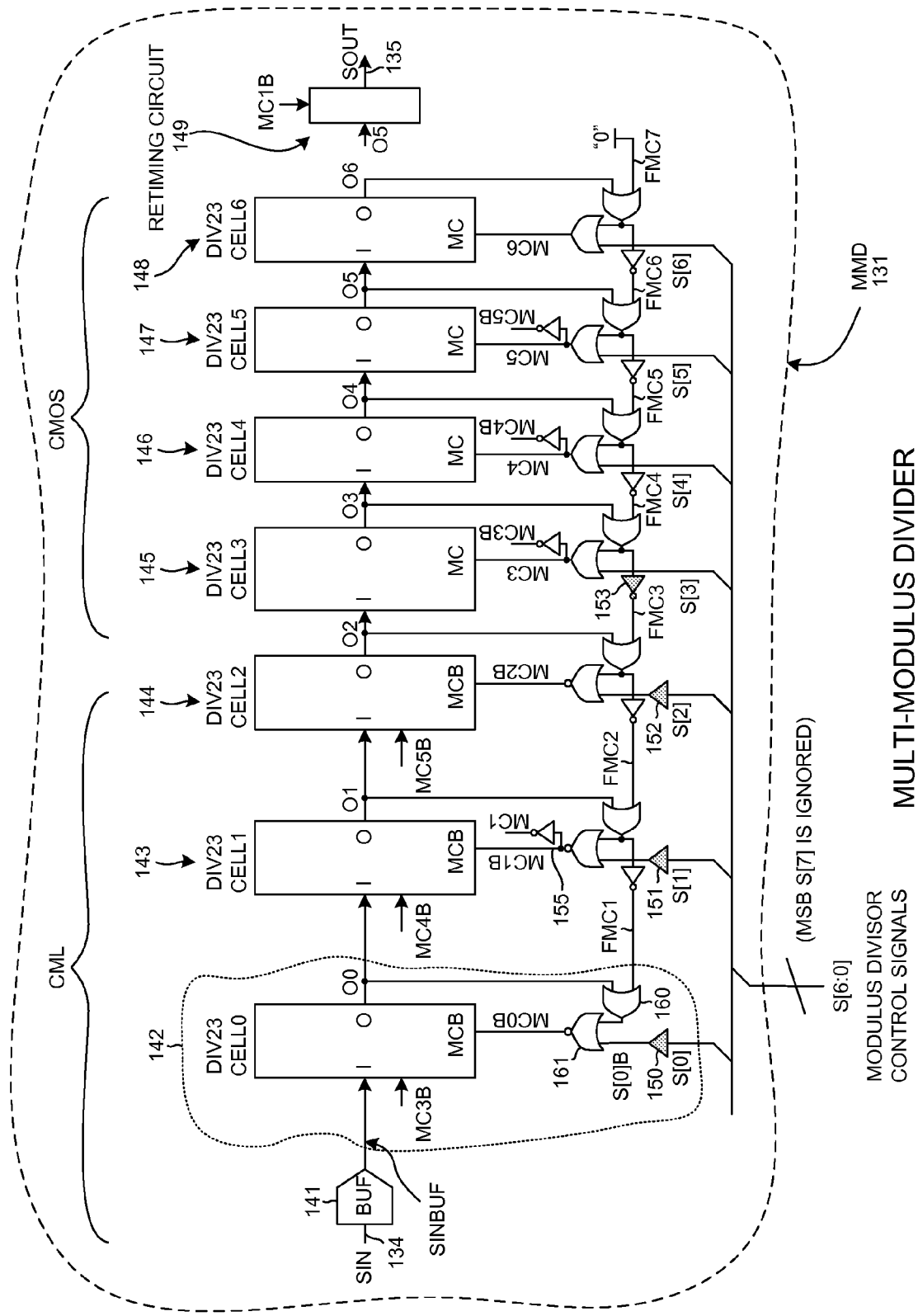
FIG. 4 is a diagram of the frequency divider of the local oscillator of FIG. 3. The frequency divider is a multi-modulus divider (MMD). The diagram is a conceptual diagram using logic gate symbols.

High-Level Description Of Multi-Modulus Divider:

FIG. 4 is a more detailed diagram of novel MMD 131 of FIG. 3. MMD 131 includes an input buffer 141, a chain of seven multi-modulus divider stages (MDS stages) 142-148, and a novel retiming circuit 149. The first three MDS stages 142-144 are implemented in current mode logic (CML). The last four MDS stages 145-148 are implemented in complementary metal oxide semiconductor (CMOS) logic. Buffers and inverter 150-153 convert from CMOS logic signals and levels to CML logic signals and levels. Each MDS stage receives an input signal and frequency divides that signal by two or by three, and outputs the result as an output signal. In FIG. 4, the seven MDS stages are designated DIV23CELL0 through DIV23CELL6. The output signals output by the seven MDS stages are designated O0 through O6, respectively. Each MDS stage of FIG. 4 can divide by either two or by three depending on the values of a modulus divisor control signal S and a feedback modulus control signal FMC. The letters FMC here stand for "feedback modulus control". The divisor value DV that the overall MMD 131 divides by is determined by the values of the seven S modulus divisor control signals S[6:0].

Figure 5:
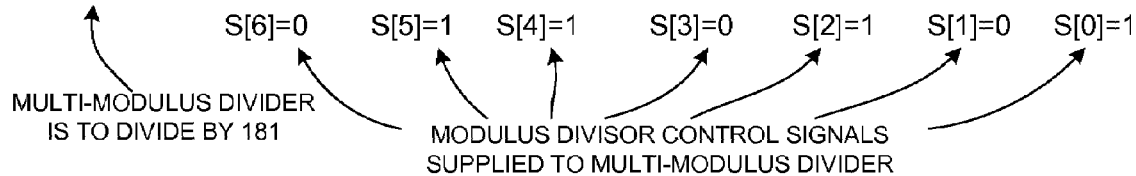
FIG. 5 sets forth an equation that indicates what the value of S[6:0] should be in order for the seven-stage MMD of FIG. 4 to divide by a desired divisor.

FIG. 5 sets forth an equation that indicates what the modulus divisor control signals S[6:0] should be in order for MMD 131 to divide by a desired divisor value DV. If, for example, MMD 131 is to divide by a divisor value of 181, then S[6:0] should be the value [0110101].

Figure 6:
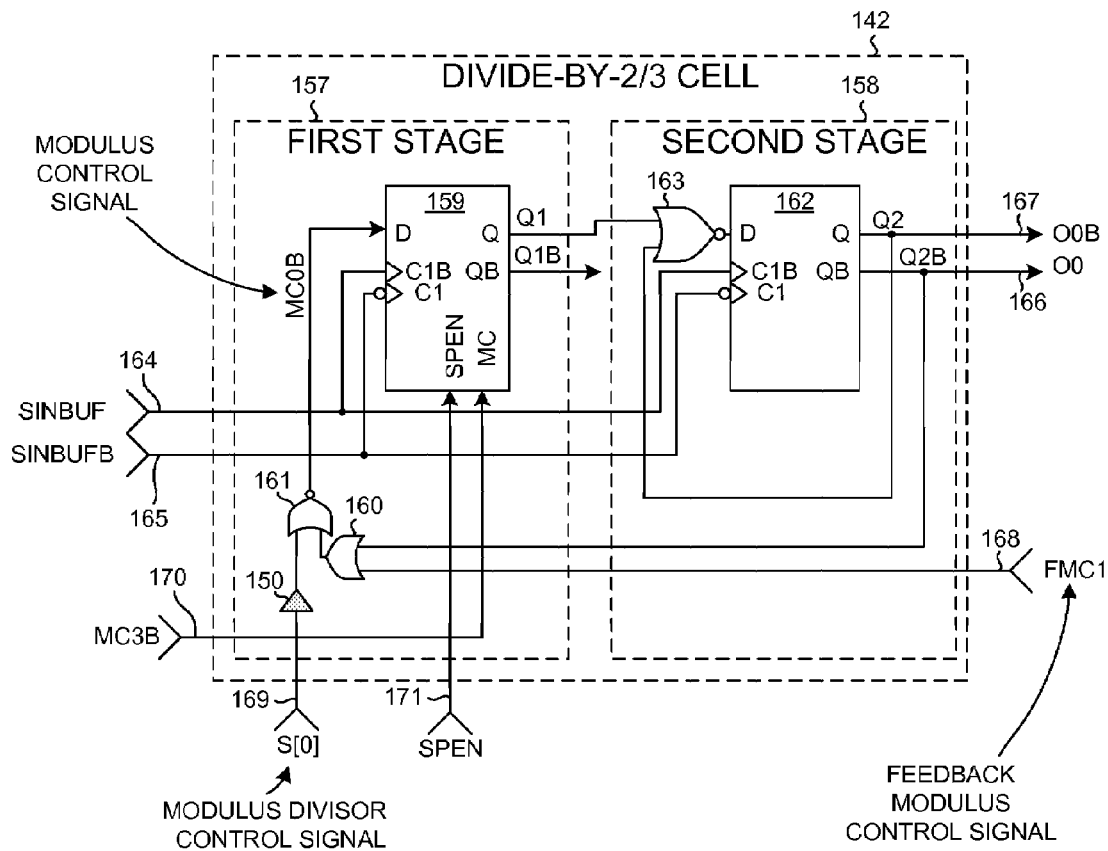
FIG. 6 is a conceptual diagram of one MDS of the MMD of FIG. 4.

High-Level Description of an MDS Stage:

FIG. 6 is a simplified diagram of the first MDS stage 142 of MMD 131 of FIG. 4. The first MDS stage 142 has a structure that is representative of the structures of the other MDS stages 143-148. First MDS 142 includes a first stage 157 and a second stage 158. First stage 157 includes a D-type flip-flop 159, an OR gate 160, a NOR gate 161, and buffer 150. The OR gate 160, NOR gate 161 and buffer 150 of FIG. 8 are the same OR gate 160, NOR gate 161 and buffer 150 as illustrated in FIG. 4. In one implementation, the functionality of gates 160 and 161 is incorporated into the circuitry of flip-flop 159 where flip-flop 159 is a CML flip-flop. Second stage 158 includes a D-type flip-flop 162 and a NOR gate 163. In one implementation, the functionality of NOR gate 163 is incorporated into the circuitry of flip-flop 162 where flip-flop 162 is a CML flip-flop.

MDS stage 142 receives differential input signals SINBUF and SINBUFB on input leads 164 and 165 and outputs the differential output signals O0 and O0B on output leads 166 and 167. Input lead 168 is an input lead for receiving the feedback modulus control signal FMC1 from MDS stage 143. Input lead 169 is an input lead for receiving the modulus divisor control signal S[0] that determines whether MDS 142 will be in a "divide-by-two mode" or will be in a "divide-by-three mode". Input leads 170 and 171 are used to receive signals for powering down the first stage 159 when the first stage is outputting a constant digital logic value is not changing states. By not powering the first stage 159 in this condition, power is conserved. When the first stage 159 is powered down, a transistor (not shown) is used to couple the output leads of the first stage 159 to the appropriate digital logic value that the flip-flop 159 would be outputting were the flip-flop powered.

In operation, if modulus divisor control signal S[0] is a digital logic high, then MDS stage 142 is in the divide-by-two mode. If, on the other hand, modulus divisor control signal S[0] is a digital logic low, then MDS 142 is in the "divide-by-three mode".

In the divide-by-two mode, MDS stage 142 divides the input signal by two regardless of the digital logic level of the feedback modulus control signal FMC1. S[0] being a digital logic high causes buffer 150 to supply a digital logic high onto the leftmost input lead of NOR gate 161. NOR gate 161 therefore outputs a digital logic low, regardless of the signal output by OR gate 160. This digital logic low signal is designated MC0B because it is a "modulus control signal." MC0B being a digital logic low causes flip-flop 159 to repeatedly clock in a digital logic low value. The signal Q1 output by flip-flop 159 therefore remains a digital logic low value. Because the digital logic low value is present on the upper input lead of NOR gate 163, NOR gate 163 functions to invert the signal on its lower input lead and to supply the inverted signal onto the D input lead of flip-flop 162. NOR gate 163 therefore inverts the value output on the Q output lead of flip-flop 162 and supplies that inverted signal back onto the D input lead of flip-flop 162. Flip-flop 162 therefore functions as a toggle flip-flop to frequency divide the input signal SINBUF by two.

In the divide-by-three mode, MDS 142 either divides by two or three depending on the state of flip-flop 162 and the logic level of feedback modulus control signal FMC1. If both feedback modulus control signal FMC1 and the Q2B signal output from flip-flop 162 have digital logic low levels, then MDS 142 divides by three during three subsequent periods of input signal SINBUF. If both FMC1 and Q2B have digital logic low values, then OR gate 160 outputs a digital logic low value. Both inputs of NOR gate 161 are therefore digital logic low values. NOR gate 161 asserts modulus control signal MC0B to a digital logic high value. This digital logic high value is then clocked into flip-flop 159. When the digital logic high value appears on the Q output lead of flip-flop 159, the output of NOR gate 163 is forced low. NOR gate 163 outputs this digital logic low value, regardless of the digital logic value supplied onto the lower input lead of NOR gate 163. The digital logic low value on the D input lead of flip-flop 162 is clocked into flip-flop 162, effectively extending for one clock period the current low pulse period during the toggling of flip-flop 162. The low value of the Q output of flip-flop 162 serves to remove the digital logic low value of Q2B from the upper input lead of OR gate 160 such that OR gate 160 outputs a digital logic high value which causes NOR gate 161 to force the modulus control signal MC0B back to a digital logic low level. Accordingly, the low pulse of FMC1 causes a one period delay to be inserted into the toggling of flip-flop 162. Rather than an ordinary toggle operation which would result in a dividing of the input signal SINBUF by two, the toggle operation with the one period extension effectively divides the input signal SINBUF by three. If, in the divide-by-three mode, the MDS stage 142 does not receive a low pulse of the signal FMC1, then flip-flop 159 always outputs a digital logic low onto the upper input lead of NOR gate 163 and flip-flop 162 of the second stage continues to toggle and to perform divide-by-two operations. It is therefore seen that the value of modulus control signal MC0B determines whether MDS 142 divides by two or by three during the next clock periods.

Figure 7:
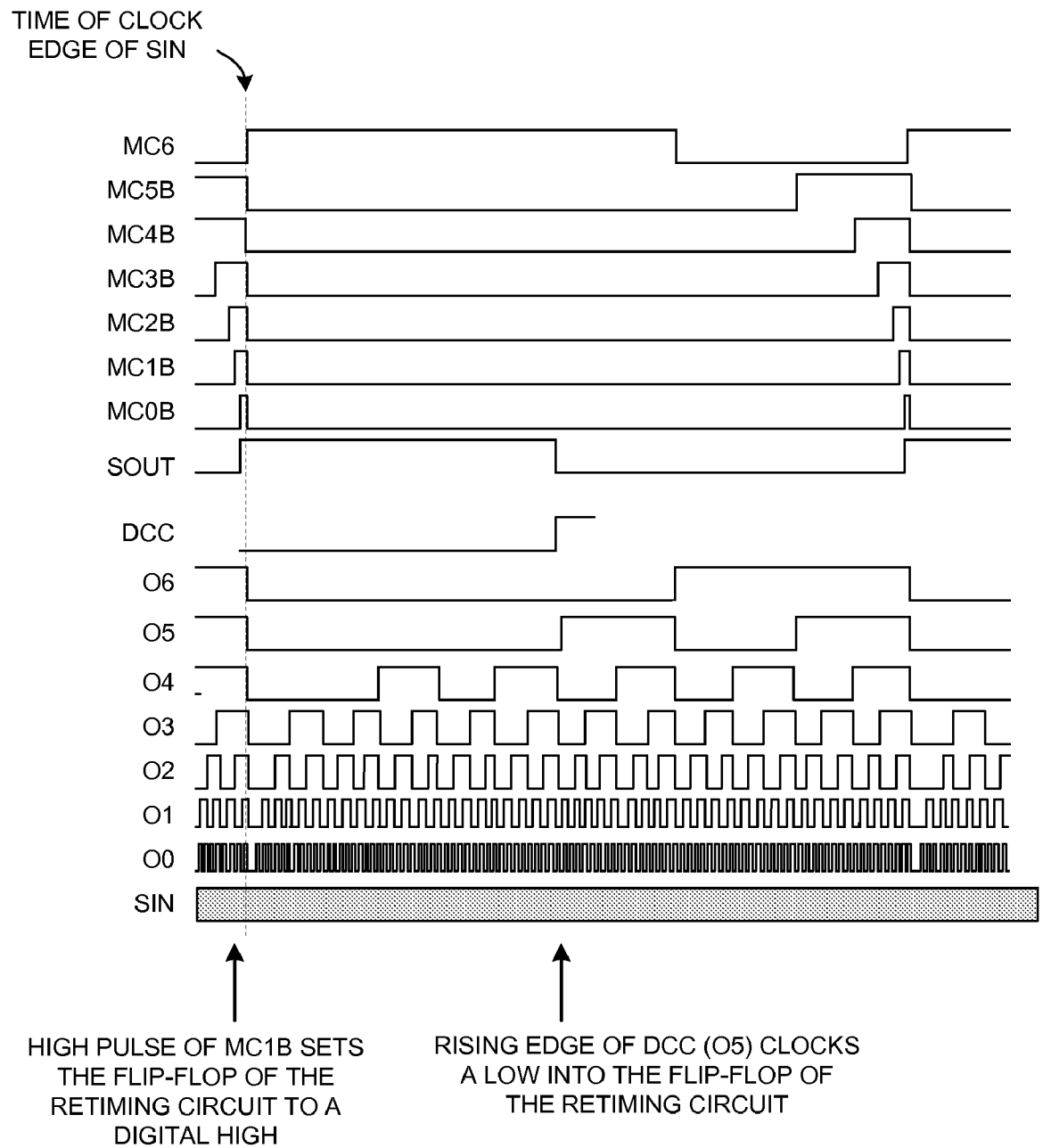
FIG. 7 is a waveform diagram that illustrates an operation of the MMD of FIG. 4.

MMD and Retiming Circuit Operation:

FIG. 7 is a waveform diagram that illustrates operation of MMD 131 of FIG. 4. The signals 00 through 06 are the output signals of the MDS stages 142 through 148. The signal MC0B is the modulus control signal discussed above in connection with FIG. 6. The signals MC0B through MC5B and MC6 are the modulus control signals illustrated in FIG. 4. The input signal SIN that is supplied to MMD 131 is represented as a block because its frequency is too high for individual transitions to be illustrated in the waveform diagram of FIG. 7. The output signal SOUT is the output signal of the novel retiming circuit 149 of FIG. 4. The signal designated DCC is a "duty cycle correction signal" used to correct the duty cycle of the modulus control signal. One example of the DCC signal is the MDS output signal O5.

Figure 8A:
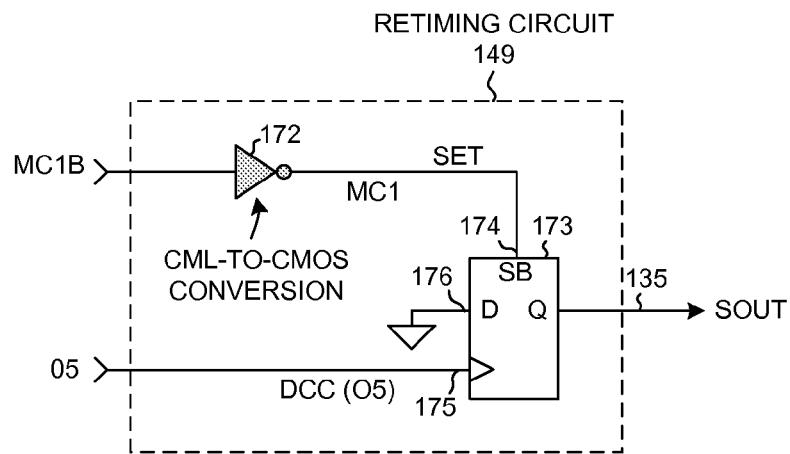
FIG. 8A is a diagram of a first example of the retiming circuit 149 of the MMD of FIG. 4.

FIG. 8A is a more detailed diagram of one example of retiming circuit 149 of MMD 131 of FIG. 4. Retiming circuit 149 includes an inverter 172 and a CMOS (complementary metal oxide semiconductor) sequential logic element 173. Sequential logic element 173 in this case is a D-type flip-flop. In addition to inverting logic values, inverter 172 converts from CML signal levels to CMOS signal levels. In the example of FIG. 8A, the duty cycle correction signal is the output signal O5 that is output from MDS 147.

Figure 8B:
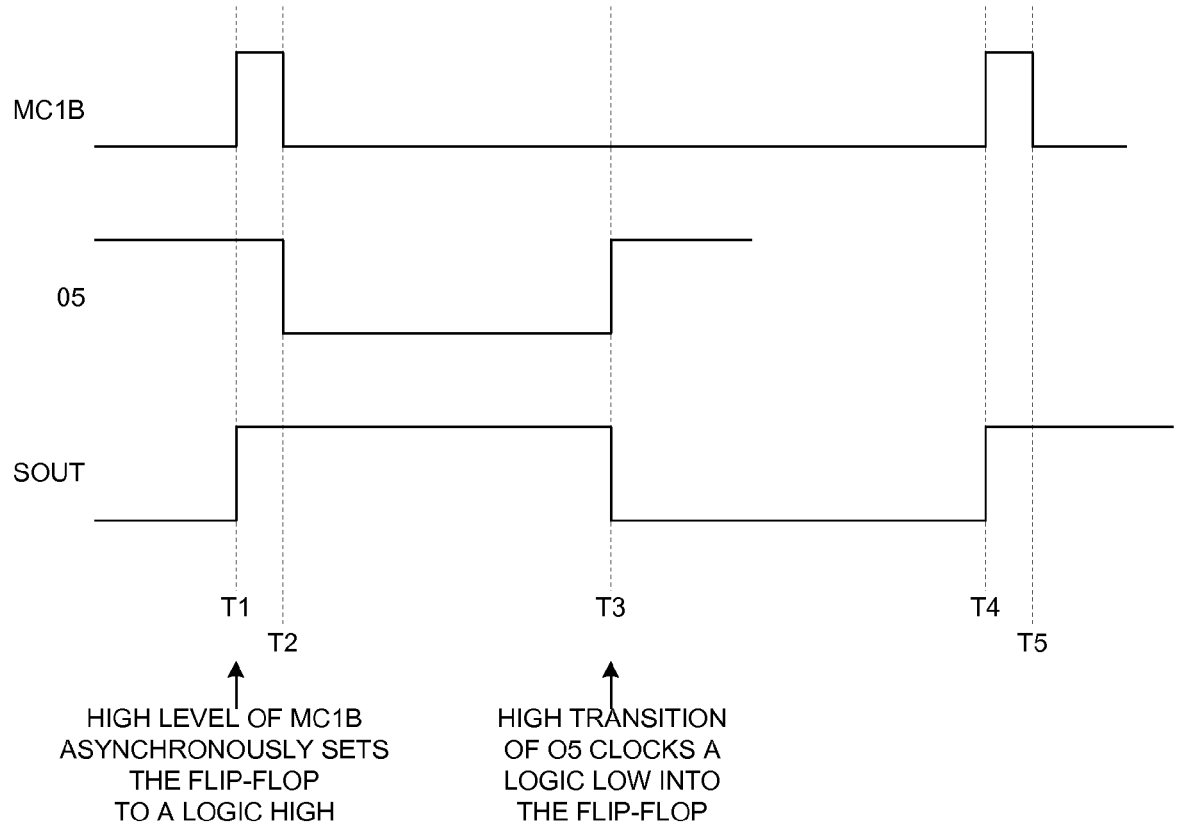
FIG. 8B is a simplified waveform diagram that shows how the retiming circuit of FIG. 8A generates the MMD output signal SOUT.

FIG. 8B is a simplified waveform diagram that illustrates operation of retiming circuit 149 of FIG. 8A. When modulus control signal MC1B transitions high at time T1, then a digital logic low value is supplied onto the asynchronous active low SET input lead 174 of flip-flop 173. In the example of FIG. 4, modulus control signal MC1B is a CML signal within the second MDS stage 143. When modulus control signal MC1B transitions high, then flip-flop 173 is asynchronously placed into to a first state (i.e., the SET state). In this state, flip-flop 173 asserts the signal SOUT on output node 135 to a digital logic high value. Next, at time T3, the output signal O5 that is output from MDS stage 147 transitions to a digital logic high value. MDS stage 147 is realized in CMOS circuitry, and signal O5 has CMOS signal levels. The low-to-high signal transition of signal O5 at time T3 is supplied onto the clock input lead 175 of flip-flop 173. The low-to-high signal transition causes flip-flop 173 to clock in the digital logic low value on the D input lead 176 of flip-flop 173. Flip-flop 173 is therefore placed into a second state (i.e., the RESET state). In this state, flip-flop 173 deasserts the signal SOUT on output node 135 to a digital logic low value. Because the low-to-high transition of signal O5 occurs about halfway between adjacent high pulses of modulus control signal MC1B as illustrated in FIG. 7 (and as illustrated in the simplified diagram of FIG. 8B), the resulting MMD output signal SOUT has a duty cycle that is approximately 50/50.

In a conventional MMD retiming circuit, the high speed MMD input signal passing into the MMD is generally the signal used to synchronize the MMD output signal to reduce jitter in the MMD output signal. Using such a high speed signal to do the synchronizing causes the retiming circuit to consume a large amount of power. In one advantageous aspect, it is recognized that modulus control signal MC1B of FIG. 4 is a low-jitter signal that transitions at a time when the period of the desired output signal SOUT should transition. The MC1B signal is therefore used in the circuit of FIG. 8A to switch logic levels of the signal SOUT. The modulus control signal MC1B transitions only twice during each period of the output signal SOUT. The rising edges of the output signal SOUT generated by the retiming circuit of FIG. 8A have low jitter with respect to the SIN input signal of MMD 131 because the MC1B modulus control signal has little jitter with respect to the input signal SIN. MC1B has little jitter because the MDS stage that generates the MC1B signal, MDS 143, is an MDS stage early in the chain of MDS stages. Accumulated jitter in the MC1B signal due to preceding MDS stages is therefore small because there is only one preceding MDS stage, MDS stage 142. The circuit of FIG. 8A does not include any flip-flop or other sequential logic element that is clocked at the high frequency of the MMD input signal SIN. Flip-flop 173 is clocked at the same frequency as the lower frequency output signal SOUT, and therefore consumes less switching power than a sequential logic element in a conventional MMD retiming circuit that is clocked at the much higher frequency of the input signal SIN. MC1B has substantially no pulses with pulsewidths as short as the shortest pulses of the input signal SIN. Because flip-flop 173 is clocked at a slower frequency that SIN and with longer minimum pulsewidths than SIN has, flip-flop 173 can be and is realized in CMOS circuitry. By realizing the sequential logic element of the retiming circuit in CMOS circuitry, DC power consumption of the retiming circuit is reduced in comparison to a conventional retiming circuit that involves a CML or other high speed sequential logic element that has a significant DC current draw. In addition, the technique of using a modulus control signal to assert the output signal SOUT to a first digital logic level and then and using an appropriate MDS stage output signal to deassert the output signal SOUT at the appropriate time does not require any phase relationship between the modulus control signal and the MDS output signal. The lack of a difficult-to-achieve phase relationship requirement simplifies circuit design.

Figure 9A:
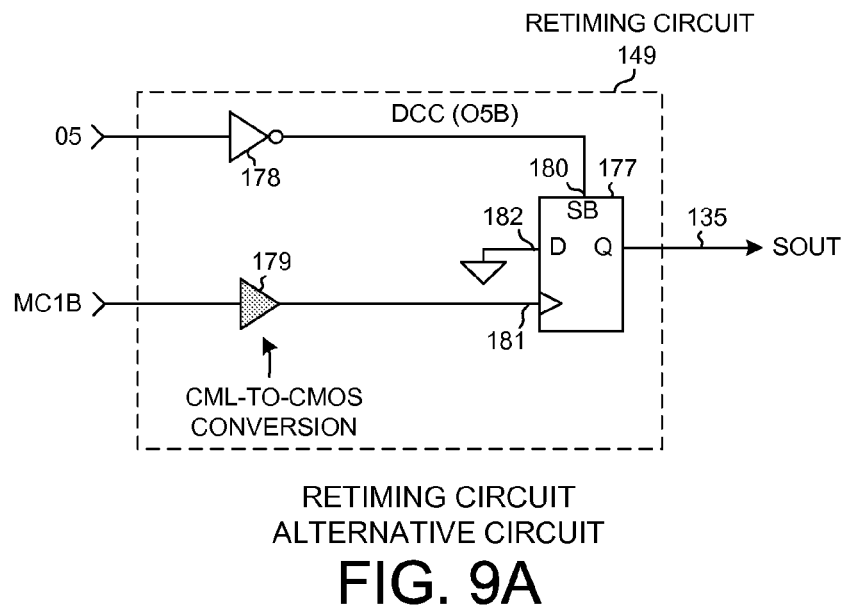
FIG. 9A is a diagram of a second example of the retiming circuit 149 of the MMD of FIG. 4.

FIG. 9A is a detailed diagram of another example of retiming circuit 149 of MMD 131 of FIG. 4. Retiming circuit 149 of FIG. 9A includes a sequential logic element 177 (in this case, a flip-flop), a CMOS inverter 178, and a non-inverting CML-to-CMOS buffer 179.

Figure 9B:
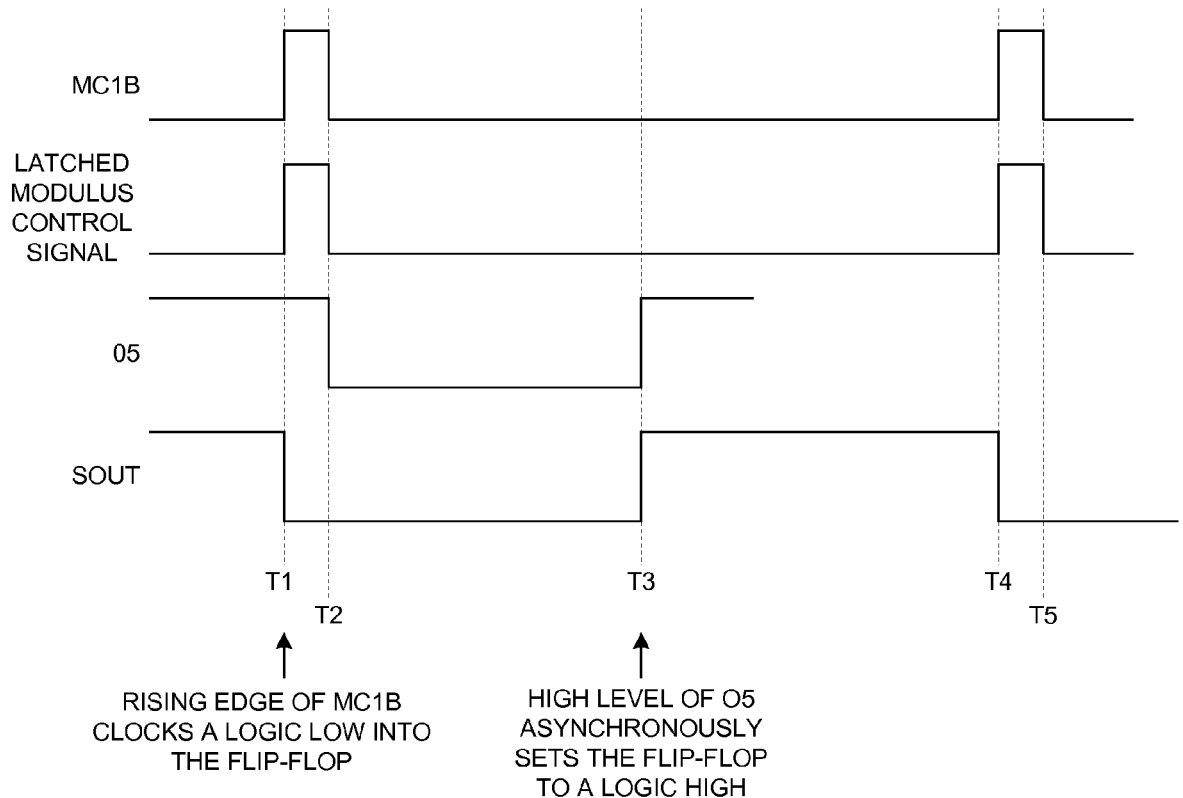
FIG. 9B is a simplified waveform diagram that shows how the retiming circuit of FIG. 9A generates the MMD output signal SOUT.

FIG. 9B is a simplified waveform diagram that illustrates operation of retiming circuit 149 of FIG. 9A. When modulus control signal MC1B transitions low-to-high a time T1, the signal is converted from CML to CMOS signal levels, and is supplied to the clock input lead 181 of flip-flop 177. The low-to-high transition of the signal on the clock input lead 181 of flip-flop 177 causes flip-flop 177 to clock in the digital logic low level on D input lead 182. This places flip-flop 177 into a first state (i.e., the RESET state) and causes flip-flop 177 to force the MMD output signal SOUT on output node 135 to a digital logic low level. Inverter 178 inverts the MDS output signal O5 such that the rising edge output signal O5 at time T3 is supplied as a falling edge onto the active low asynchronous SET input lead 180 of flip-flop 177. The low level of this signal places flip-flop 177 into a second state (i.e. the SET state) at time T3 and forces the MMD output signal O5 to a digital logic high level. The example of the retiming circuit 149 of FIG. 9A therefore utilizes the same technique of using a modulus control signal to assert the output signal SOUT to a first digital logic level (in this case, a digital logic low level) and then using an appropriate MDS stage output signal to deassert the output signal SOUT to a second digital logic level (in this case, a digital logic high level) at the appropriate time so that the signal SOUT has a duty cycle that is approximately 50/50.

Figure 10:
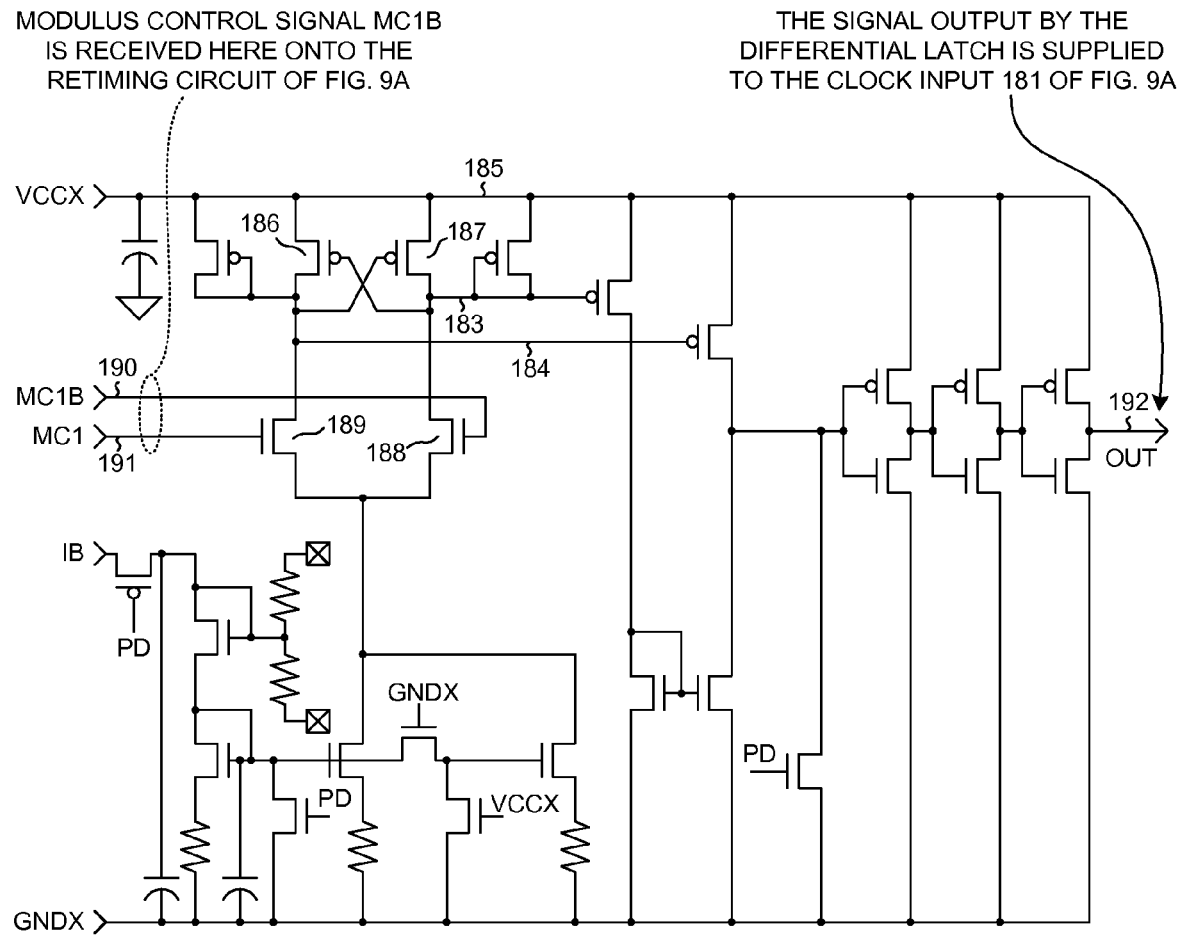
FIG. 10 is a circuit diagram of a differential latch that can be used in the circuit of FIG. 9A in place of, and rather than, the CML-to-CMOS buffer 179.

FIG. 10 is a circuit diagram of a differential latch that can be used in the circuit of FIG. 9A in place of, and rather than, the CML-to-CMOS buffer 179. The difference in impedance between the "node 183 to supply conductor 185 impedance"

and the "node 184 to supply conductor 185 impedance" depends on the differential voltage between the MC1B and MC1 input leads of the differential latch. For example, if the voltage on the MC1B input lead were to increase with respect to the voltage on the MC1 node, then the voltage on node 183 would decrease. This decrease would decrease the voltage on the gate of P-channel transistor 186. P-channel transistor 186 would be made more conductive, which would in turn increase the voltage on node 184. Due to the cross-coupled nature of P-channel transistors 186 and 187, P-channel transistor 186 is made more conductive than is P-channel transistor 187. The differential between the "node 183 to supply conductor 185 impedance" and the "node 184 to supply conductor 185 impedance" accentuates the effect of the differential conductances of transistors 188 and 189. In this sense, the circuit can be considered to have a latching characteristic. In comparison to a conventional retiming circuit that would have consumed approximately ten milliamperes of current to retime an MMD output signal of a particular frequency, the retiming circuit of FIG. 9A employing the differential latch of FIG. 10 is simulated to consume less than three milliamperes to synchronize the same MMD output signal. The differential latch receives signals having CML signal levels on input leads 190 and 191 and outputs a signal having CMOS logic levels onto output lead 192.

Figure 11:
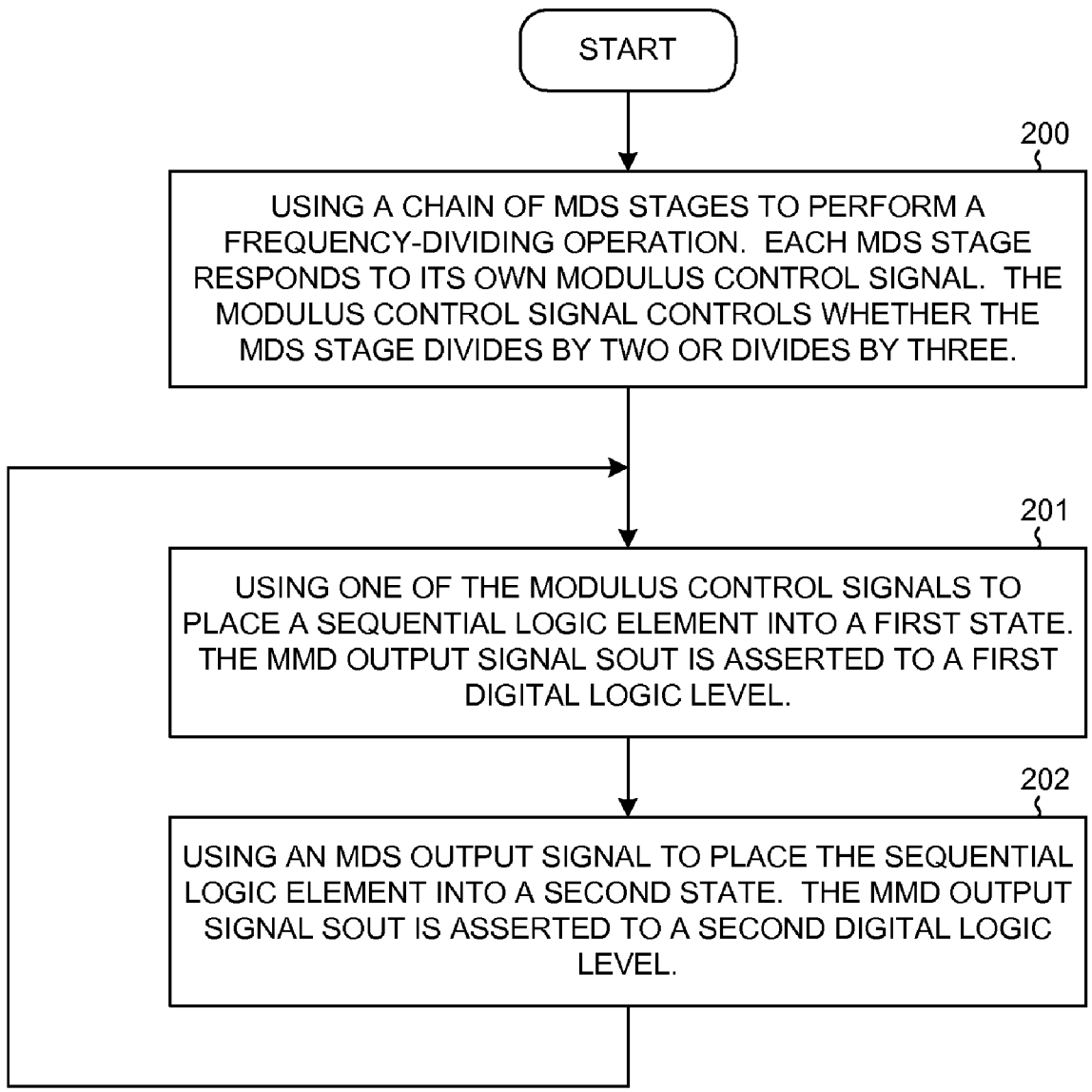
FIG. 11 is a flowchart of a method in accordance with one novel aspect.

FIG. 11 is a flowchart diagram of a method in accordance with one novel aspect. A multi-modulus divider (MMD) is used (step 200) to perform a frequency-dividing operation. The MMD includes a chain of divide-by-⅔ cells. Each of the divide-by-⅔ cells responds to its own modulus control signal that controls whether the divide-by-⅔ cell divides by two or divides by three. In one example, the MDS stages 142-148 of FIG. 4 are divide-by-⅔ cells. An MMD output signal SOUT is generated by using (step 201) one of the modulus control signals to place a sequential logic element into a first state, and by using (step 202) a divide-by-⅔ cell output signal to place the sequential logic element into a second state. In one example, the modulus control signal used to place the sequential logic element into the first stage is the modulus control signal MC1B identified in FIG. 4 and the output signal used to place the sequential logic element into the second state is the output signal O5 identified in FIG. 4. When the sequential logic element is in the first state, the sequential logic element forces the output signal SOUT to a first digital logic level. When the sequential logic element is in the second state, the sequential logic element forces the output signal SOUT to a second digital logic level. As the multi-modulus divider operates, the sequential logic element is alternatingly placed into the first state and then the second state such that the SOUT signal repeatedly transitions between the first and second digital logic levels and such that the SOUT signal has a duty cycle that is approximately 50/50.

Although certain specific embodiments are described above for instructional purposes, the teachings of this patent document have general applicability and are not limited to the specific embodiments described above. Although an example is set forth that uses one particular modulus control signal MC1B to place the sequential logic element of the retiming circuit into the first state, other of the modulus control signals (for example, another of MC0B through MC5B) can be used. Although an example is set forth that uses one particular MDS output signal O5 as the duty cycle correction signal, other MDS output signals can be used. In some applications it may be desirable to use a duty cycle correction signal that is a combinatorial logic function of multiple ones of the MDS output signals. The retiming circuit can be followed by additional signal conditioning sequential logic elements that are clocked by low frequency signals. Although the retiming circuits described above employ flip-flops as their sequential logic elements, other embodiments of the novel retiming circuit employ latches as their sequential logic elements. Accordingly, various modifications, adaptations, and combinations of the various features of the described specific embodiments can be practiced without departing from the scope of the claims that are set forth below.

What is claimed is:

1. A multi-modulus divider (MMD) comprising:
    a chain of divide-by-⅔ cells, wherein each divide-by-⅔ cell of the chain receives an input signal and outputs an output signal, wherein each of the divide-by-⅔ cells responds to a modulus control signal that controls whether the divide-by-⅔ cell divides by two or divides by three;
    a sequential logic element, wherein a change in one of the modulus control signals causes the sequential logic element to be placed into a first state, and wherein a change in one of the output signals causes the sequential logic element to be placed into a second state, and further wherein the sequential logic element comprises an input lead and an output lead, wherein the sequential logic element outputs an MMD output signal onto the output lead, and wherein the MMD output signal has a duty cycle that is approximately 50/50; and
    a differential latch comprising a latch input lead and a latch output lead, the latch input lead being coupled to receive one of the modulus control signals, and wherein the latch output lead of the differential latch is coupled to the sequential logic element input lead.

2. The MMD of claim 1, wherein said one of the modulus control signals is supplied to the sequential logic element via the sequential logic element input lead.

3. The MMD of claim 1, wherein an inverted version of said one of the modulus control signals is supplied to the sequential logic element via the sequential logic element input lead.

4. The MMD of claim 1, wherein one of the output signals is supplied to the sequential logic element via the sequential logic element input lead.

5. The MMD of claim 1, wherein an inverted version of said one of the output signals is supplied to the sequential logic element via the sequential logic element input lead.

6. The MMD of claim 1, wherein said one of the modulus control signals is a modulus control signal that controls whether one of the divide-by-⅔ cell divides by two or divides by three.

7. The MMD of claim 1, wherein the MMD receives an MMD input signal having a frequency F, frequency divides the MMD input signal, and outputs an MMD output signal, wherein the MMD input signal is received onto a divide-by-⅔ cell DIV23CELL0, and wherein the sequential logic element does not receive any signal of a frequency equal to or greater than F.

8. The MMD of claim 1, wherein a first portion of the MMD is realized in CML (Current Mode Logic) logic circuitry, and wherein a second portion of the MMD is realized in CMOS (Complementary Metal Oxide Semiconductor) logic circuitry, and wherein the sequential logic element is realized in CMOS logic circuitry.

9. A method comprising:
    (a) using a chain of divide-by-⅔ cells to perform a frequency-dividing operation, wherein each divide-by-⅔ cell receives an input signal and outputs an output signal, wherein each of the divide-by-⅔ cells responds to a modulus control signal that controls whether the divide-by-⅔ cell divides by two or divides by three;

(b) using one of the modulus control signals to place a sequential logic element into a first state;

(c) selecting one of the divide-by-⅔ cell output signals that transitions from a first digital logic level to a second digital logic level about halfway between adjacent pulses of the modulus control signal used to place the sequential logic element into the first state;

(d) using the selected one of the output signals to place the sequential logic element into a second state; and (e) using a differential latch to receive one of the modulus control signals and output a latch output signal to the sequential logic element.

10. The method of claim 9, wherein said one modulus control signal used in step (b) is the modulus control signal that controls whether the first one of the divide-by-⅔ cells divides by two or divides by three.

11. The method of claim 9, wherein said one modulus control signal used in step (b) is the modulus control signal that controls whether the second one of the divide-by-⅔ cells divides by two or divides by three.

12. The method of claim 9, wherein step (b) involves supplying said one of the modulus control signals onto a first input lead of the sequential logic element, and wherein step (d) involves supplying said one of the output signals onto a second input lead of the sequential logic element.

13. The method of claim 9, wherein step (b) involves putting the sequential logic element into the first state in response to a transitioning of said one of the modulus control signals from the first digital logic level to the second digital logic level.

14. The method of claim 9, wherein step (d) involves putting the sequential logic element into the second state in response to a transitioning of said one of the output signals from the first digital logic level to the second digital logic level.

15. A multi-modulus divider, comprising:
    means for using a chain of divide-by-⅔ cells to perform a frequency-dividing operation, wherein each divide-by-⅔ cell receives an input signal and outputs an output signal, wherein each of the divide-by-⅔ cells responds to a modulus control signal that controls whether the divide-by-⅔ cell divides by two or divides by three;
    means for using one of the modulus control signals to place a sequential logic element into a first state;
    means for selecting one of the divide-by-⅔ cell output signals that transitions from a first digital logic level to a second digital logic level about halfway between adjacent pulses of the modulus control signal used to place the sequential logic element into the first state;
    means for using the selected one of the output signals to place the sequential logic element into a second state; and
    means for using a differential latch to receive one of the modulus control signals and output a latch output signal to the sequential logic element.

16. The multi-modulus divider of claim 15, wherein the modulus control signal used to place the sequential logic element into a first state is the modulus control signal that controls whether the first one of the divide-by-⅔ cells divides by two or divides by three.

17. The multi-modulus divider of claim 15, wherein the modulus control signal used to place the sequential logic element into a first state is the modulus control signal that controls whether the second one of the divide-by-⅔ cells divides by two or divides by three.

18. The multi-modulus divider of claim 15, wherein the means for using one of the modulus control signals to place a sequential logic element into a first state further comprises:
    means for supplying one of the modulus control signals onto a first input lead of the sequential logic element, and means for using the selected one of the output signals to place the sequential logic element into a second state comprises means for supplying one of the output signals onto a second input lead of the sequential logic element.

19. The multi-modulus divider of claim 15, wherein the means for using one of the modulus control signals to place a sequential logic element into a first state further comprises:
    means for putting the sequential logic element into the first state in response to a transitioning of one of the modulus control signals from the first digital logic level to the second digital logic level.

20. The multi-modulus divider of claim 15, wherein the means for using the selected one of the output signals to place the sequential logic element into a second state further comprises:
    means for putting the sequential logic element into the second state in response to a transitioning of one of the output signals from the first digital logic level to the second digital logic level.

* * * * *